US007215889B2

(12) United States Patent
Light

(10) Patent No.: US 7,215,889 B2
(45) Date of Patent: May 8, 2007

(54) COMPACT OPTICAL TRANSCEIVERS FOR HOST BUS ADAPTERS

(75) Inventor: Greta Light, San Mateo, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/829,608

(22) Filed: Apr. 22, 2004

(65) Prior Publication Data
US 2005/0105915 A1 May 19, 2005

Related U.S. Application Data

(60) Provisional application No. 60/520,885, filed on Nov. 17, 2003.

(51) Int. Cl.
*H04B 10/00* (2006.01)
(52) U.S. Cl. .................. 398/135; 398/201; 398/212
(58) Field of Classification Search ............... 398/135, 398/136, 137, 138, 139, 201, 212
See application file for complete search history.

(56) References Cited
U.S. PATENT DOCUMENTS 5,337,398 A * 8/1994 Benzoni et al. ............... 385/90
6,318,909 B1 * 11/2001 Giboney et al. ............... 385/90
6,454,470 B1 * 9/2002 Dwarkin et al. ............... 385/93
6,632,030 B2 * 10/2003 Jiang et al. ................... 385/93

OTHER PUBLICATIONS

U.S. Appl. No. 10/829,609, filed Apr. 22, 2004, Light.
U.S. Appl. No. 10/829,742, filed Apr. 22, 2004, Light.
Documentation entitled "SANblade: 2-Gbps Fibre Channel to PCI Express Host Bus Adapters", copywrite 2003 by QLogic Corporation.

* cited by examiner

*Primary Examiner*—Christina Leung
(74) *Attorney, Agent, or Firm*—Workman Nydegger

(57) ABSTRACT

An optical transceiver is provided that includes a transceiver substrate arranged substantially perpendicular to longitudinal axes respectively defined by a transmit optical subassembly and receive optical subassembly. The transceiver substrate is configured to electrically and physically connect to the transmit optical subassembly and the receive optical subassembly, and includes a connector configured and arranged to interface with a host bus adapter. The combination of the host bus adapter and optical transceiver is sized and configured to be received within a standard slot of a host system, such as a PCI or PCMCIA slot. In this way, one or more optical connections are integrated within the host device or system.

19 Claims, 5 Drawing Sheets

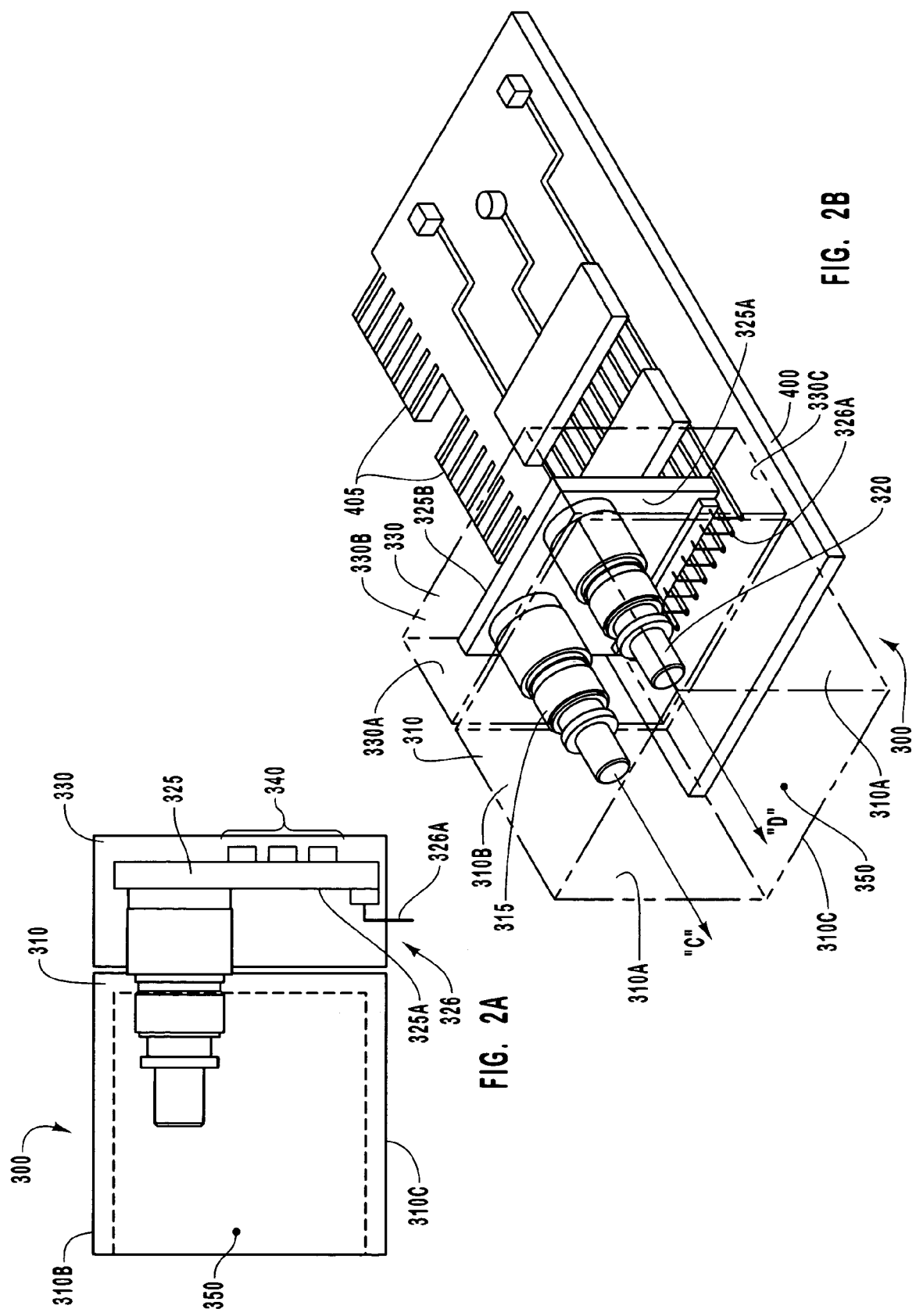

COMPACT OPTICAL TRANSCEIVERS FOR HOST BUS ADAPTERS

CROSS-REFERENCE TO RELATED APPLICATIONS

This application claims the benefit of U.S. Provisional Patent Application Ser. No. 60/520,885 filed on Nov. 17, 2003, entitled "COMPACT OPTICAL TRANSCEIVERS FOR HOST BUS ADAPTERS," incorporated herein in its entirety by this reference.

BACKGROUND OF THE INVENTION

1. The Field of the Invention

This invention relates generally to optical transceivers. More specifically, exemplary embodiments of the invention are concerned with optical transceivers configured to be implemented within relatively compact components, such as host bus adapters, while maintaining compliance with established form factors and other standards.

2. Related Art

Fiber optic technology is increasingly employed as a method by which information can be reliably transmitted via a communications network. Networks employing fiber optic technology are known as optical communications networks, and are marked by high bandwidth and reliable, high-speed data transmission.

Optical communications networks employ optical transceivers in transmitting information via the network from a transmission node to a reception node. Generally, such optical transceivers implement both data signal transmission and reception capabilities, such that a transmitter portion of a transceiver converts an incoming electrical data signal into an optical data signal, while a receiver portion of the transceiver converts an incoming optical data signal into an electrical data signal.

More particularly, an optical transceiver at the transmission node receives an electrical data signal from a network device, such as a computer, and converts the electrical data signal to a modulated optical data signal using an optical transmitter such as a laser. The optical data signal can then be transmitted in a fiber optic cable via the optical communications network to a reception node of the network. Upon receipt by the reception node, the optical data signal is fed to another optical transceiver that uses a photodetector, such as a photodiode, to convert the received optical data signal back into an electrical data signal. The electrical data signal is then forwarded to a host device, such as a computer, for processing.

Generally, multiple components are designed to accomplish different aspects of these functions. For example, an optical transceiver can include one or more optical subassemblies ("OSA") such as a transmit optical subassembly ("TOSA"), and a receive optical subassembly ("ROSA"). Typically, each OSA is created as a separate physical entity, such as a hermetically sealed cylinder that includes one or more optical sending or receiving components, as well as electrical circuitry for handling and converting the optical signals. Within the optical transceiver, each OSA generally includes electrical connections to various additional components such as a transceiver substrate, sometimes embodied in the form of a printed circuit board ("PCB"). OSAs in a conventional transceiver are generally oriented such that a longitudinal axis defined by the OSA is substantially parallel to the transceiver substrate. The transceiver substrate, in turn, is mounted to the board of a host bus adapter ("HBA") or other component.

The transceiver substrate can include multiple other active circuitry components particularly designed to drive or handle electrical signals sent to or returning from one or more of the OSAs. Accordingly, such a transceiver substrate will usually include a number of electrical transmission lines with the one or more OSAs. Such connections may include "send" and "receive" data transmission lines for each OSA, one or more power transmission lines for each OSA, and one or more diagnostic data transmission lines for each OSA. These transmission lines are connected between the transceiver substrate and the OSA using different types of electrical connectors, examples of which include an electrical flex circuit, a direct mounting connection between conductive metallic pins extending from the OSA and solder points on the PCB, and a plug connection that extends from the PCB and mounts into electrical extensions from an OSA.

As part of ongoing efforts to reduce the size of optical transceivers and other components, manufacturing standards such as the small form factor ("SFF"), small form factor pluggable ("SFP"), and gigabit small form factor ("XFP") standards have been developed that serve to contribute to a reduction in the overall size of optical transceivers. Nonetheless, the size of most optical transceivers, even those that comply with such manufacturing standards, best suits them for external connections to a computer system, such as a desktop computer, a laptop computer, or a handheld digital device.

Alternatively, some optical transceivers are mounted in a network panel that includes multiple optical transceivers, where the network panel is configured to include an external connection to, for example, a computer system or an Ethernet network. In these, and other, applications however, conventional optical transceivers are typically not well suited for integration within such devices.

More specifically, the number of components within the transceiver, as well as the orientation and the size of SFF or SFP optical transceivers, makes it difficult, if not impossible, to integrate conventional optical transceivers into very small spaces, such as within a pluggable card for use in a laptop computer or hand held device. For example, despite their relatively compact nature, conventional SFF, SFP, and XFP optical transceiver bodies are still too wide and/or tall to fit within a typical PCMCIA laptop envelope.

A related problem concerns the connections of the optical transceiver. In particular, use of the optical transceiver as an external, rather than internal, component necessitates the use of additional connectors and connections, which increase both the overall cost associated with the system as well as the complexity of the system. As well, optical transceivers employed in an external, rather than integrated, configuration are more prone to rough handling and damage than an integrated component.

Furthermore, even if the conventional optical transceiver could fit within such an envelope, the length of the conventional optical transceiver SFF, SFP, or XFP optical transceiver is such that the transceiver substrate takes up an inordinate amount of board space on the HBA or other component to which the optical transceiver is attached. This problem is of particular concern in light of the concurrent demands for increases in functionality and decreases in component size. These, and other, considerations make conventional optical transceivers less than ideal for integration within computer systems.

Unfortunately, typical manufacturing standards and optical transceivers have not effectively addressed these problems. This is likely due in part to the fact that typical manufacturing constraints require, among other things, a minimum number of active and passive circuitry components to be present on a transceiver substrate. Thus, a designer or manufacturer may have somewhat limited latitude in terms of the type and number of components to be included in an optical transceiver.

Other constraints along similar lines relate to engineering limitations, such that miniaturization of transceiver components becomes ever more complicated as components and mounting surfaces become smaller. Moreover, increased manufacturing and engineering difficulty also translate into higher costs.

Accordingly, what is needed are optical transceivers that can fit within relatively small envelopes such that the optical transceiver can be integrated within compact components and various computing systems and devices. At the same time, such optical transceivers should comply with established manufacturing and operational standards and requirements.

BRIEF SUMMARY OF AN EXEMPLARY EMBODIMENT OF THE INVENTION

In general, exemplary embodiments of the present invention relate to compact optical transceivers that can be integrated within the relatively small physical envelopes defined by compact components, such as an HBA for use with a desktop computer, a laptop computer, or other similar computer system, while maintaining compliance with applicable operational and performance standards.

In one exemplary implementation, an optical transceiver is provided that comprises a transceiver housing wherein a ROSA and a TOSA reside. The ROSA and TOSA each define a longitudinal axis, and a transceiver substrate is mounted within the housing in a plane that is substantially perpendicular to the longitudinal axes respectively defined by the ROSA and TOSA. The transceiver substrate includes a plurality of electrical connections configured and arranged to operably interact with corresponding connections of an HBA or other compact device to which the transceiver is mounted.

As a result of the orientation of the transceiver substrate, the optical transceiver occupies relatively less board space than conventional transceivers, thus freeing board space for the inclusion of additional components and circuitry. Thus, the orientation of the transceiver substrate enables implementation of enhancements to the functionality of the device to which the optical transceiver is mounted. Moreover, the functionality of the optical transceiver itself is not compromised, since components and circuitry can be mounted to both sides of the vertically oriented transceiver substrate.

Additionally, the orientation of the transceiver substrate allows for production of relatively shorter transceivers that can be readily integrated within various devices, thus foreclosing the need for problematic external connections. These and other aspects of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 2A is a side view of one exemplary implementation of an optical transceiver, indicating the arrangement of an OSA, transceiver substrate, and connector pins of the transceiver substrate;

FIG. 2B is perspective view of the exemplary optical transceiver of FIG. 2A, indicating the arrangement of the exemplary optical transceiver with respect to a component such as an HBA;

DETAILED DESCRIPTION OF EXEMPLARY EMBODIMENTS OF THE INVENTION

With attention now to FIGS. 1A through 1D, details are provided concerning an exemplary embodiment of an optical transceiver 200. The optical transceiver 200 may take various forms including, but not limited to, an SFF, SFP, or XFP optical transceiver. The foregoing are exemplary however, and the optical transceiver 200 may be implemented in various other forms as well. More generally, embodiments of the invention are concerned with optical devices that may include one or more optical subassemblies. Further, embodiments of the invention are suitable for use in connection with a variety of data rates such as about 1 Gbps, about 2 Gbps, about 4 Gbps, and 10 Gbps, or higher.

Figure 1B:
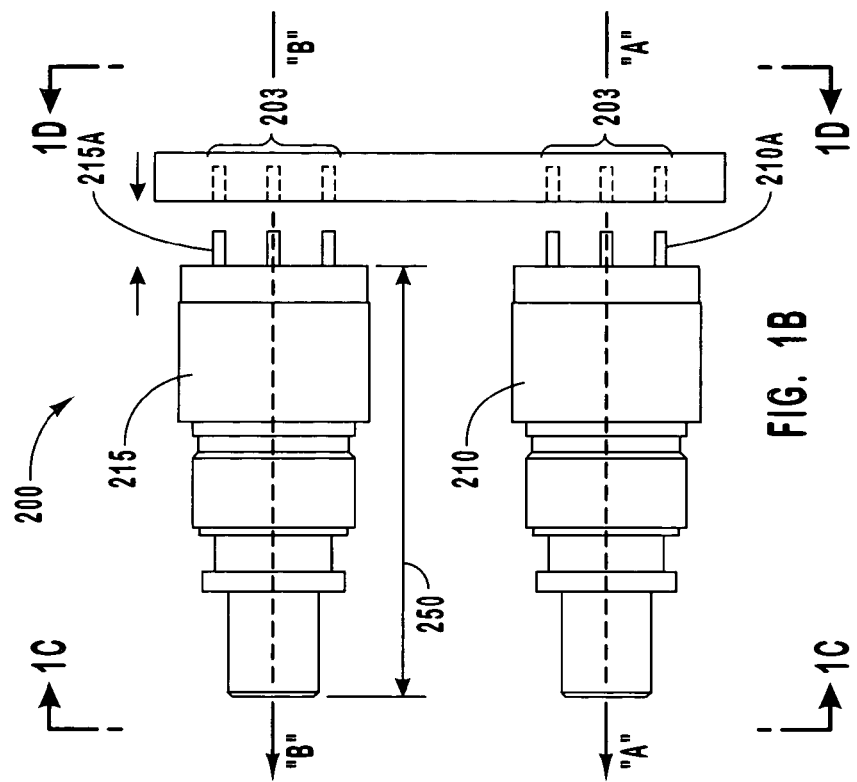
FIG. 1B is a top view of an exemplary optical transceiver illustrating the arrangement of a ROSA and TOSA relative to the transceiver substrate.
Figure 1A:
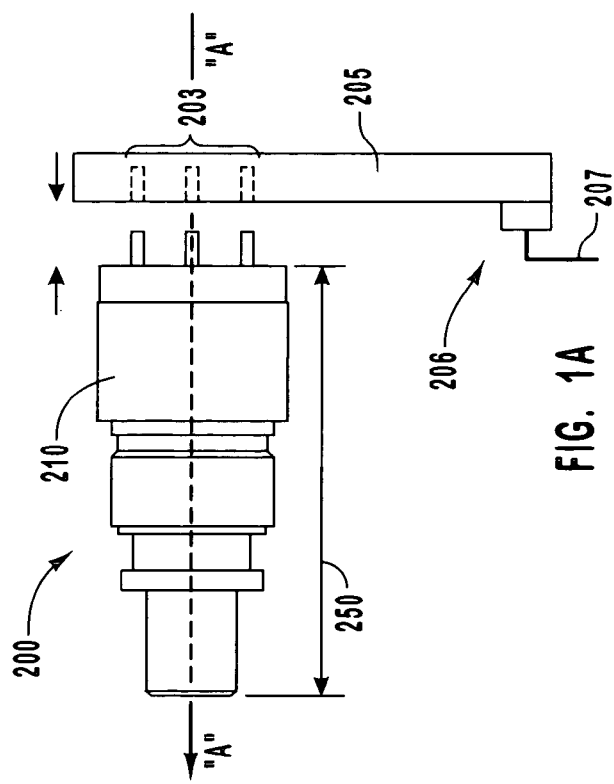
FIG. 1A is a side view of an exemplary optical transceiver that includes an OSA configured to be mounted to a vertically oriented transceiver substrate.

With particular reference first to FIGS. 1A and 1B, the optical transceiver 200 includes a transceiver substrate 205 to which optical subassemblies ("OSA") 210 and 215 are configured to be mounted. As used herein, "OSA" refers to any one of a transmit optical subassembly ("TOSA") or a receive optical subassembly ("ROSA"). Further, a "transceiver substrate" refers to a printed circuit board ("PCB") having electrically conductive elements such as circuit traces for transmitting power and/or communication signals between components of receive and transmit OSAs and another system or device, such as a computer system. Exemplarily, the transceiver PCB also includes circuits, devices and systems for facilitating the operation and control of the OSAs. Such circuits, devices and systems include, but are not limited to, a laser driver, and a postamplifier. Transceiver substrates may be referred to more generally herein as simply "substrates."

As indicated in FIG. 1A, the transceiver substrate 205 is arranged so that it resides in a plane that is substantially perpendicular to longitudinal axes "A" and "B" respectively defined by the OSAs 210 and 215 and, as discussed below, is also substantially perpendicular to top and bottom covers of a corresponding transceiver housing (not shown). The exemplary transceiver substrate 205 also includes one or more receptacles 203 configured to electrically and mechanically interface with corresponding pins 210A and 215A, respectively, of the OSAs 210 and 215. The pins 210A and 215A not only provide a conductive interface between the OSAs 210 and 215, and the transceiver substrate 205, but also provide a stable physical joint between the OSAs and the transceiver substrate 205. In one alternative implementation, the pins are situated on the transceiver substrate, and the OSAs define the receptacles. Of course, various other types of mechanical and electrical connections between the OSAs and transceiver substrate may be employed as well however.

As best illustrated in FIG. 1A, the transceiver substrate 205 further includes a connector 206 exemplarily implemented as an array of electrical connection pins 207 suitable for connecting into an HBA. The connector 206 can be any single or dual row pin header assembly, as well as a lead frame. More generally, any other type of connector may be employed consistent with the requirements of a particular application.

As thus arranged, the connector 206 enables electrical communication between circuitry (not shown) on the transceiver substrate 205 and, thus, the OSAs 210 and 215, and circuitry on the device or board to which the optical transceiver 200 is mounted (see, e.g., FIGS. 2A and 2B). More particularly, the connector 206 enables, among other things, data transmission and/or reception, as well as the transmission of control and monitoring signals, between the OSAs 210 and 215, and corresponding components on the board or components to which the optical transceiver 200 is mounted.

With more particular attention now to FIG. 1B, a top view of the optical transceiver 200 is provided that indicates an exemplary arrangement of the OSAs 210 and 215 with respect to each other and with respect to the transceiver substrate 205. In the illustrated embodiment, the OSAs 210 and 215 are arranged in a space apart configuration and are mounted to the transceiver substrate 205. As noted earlier, the transceiver substrate 205, in turn, is arranged so as to be substantially perpendicular to longitudinal axes "A" and "B" defined by the OSAs 210 and 215, respectively.

This arrangement of the OSAs 210 and 215 and the transceiver substrate 205 is useful as it provides for a relative decrease in the space required to mount the optical transceiver 200 to a PCB or other component, thus freeing space on the PCB or other component for the placement of additional circuitry and systems. Furthermore, since the OSAs 210 and 215 mount directly to the vertical surface of the transceiver substrate 205, rather than a substrate edge through, for example, a flex circuit, an improvement in physical connection stability is realized. In particular, a greater amount of surface area for mounting the OSAs allows the OSAs to better accommodate some of the forces that occur as a result of repeated plugging and unplugging of optical cables associated with the OSAs.

The illustrated arrangement of the OSAs 210 and 215 and the transceiver substrate 205 is useful for other reasons as well. For example, because the transceiver substrate 205 is vertically oriented, both sides of the transceiver substrate 205 can be used for the placement of circuitry and components. Thus, the function and operation of the optical transceiver 200 is not materially compromised by the elimination of a longitudinally oriented transceiver substrate.

Figure 1D:
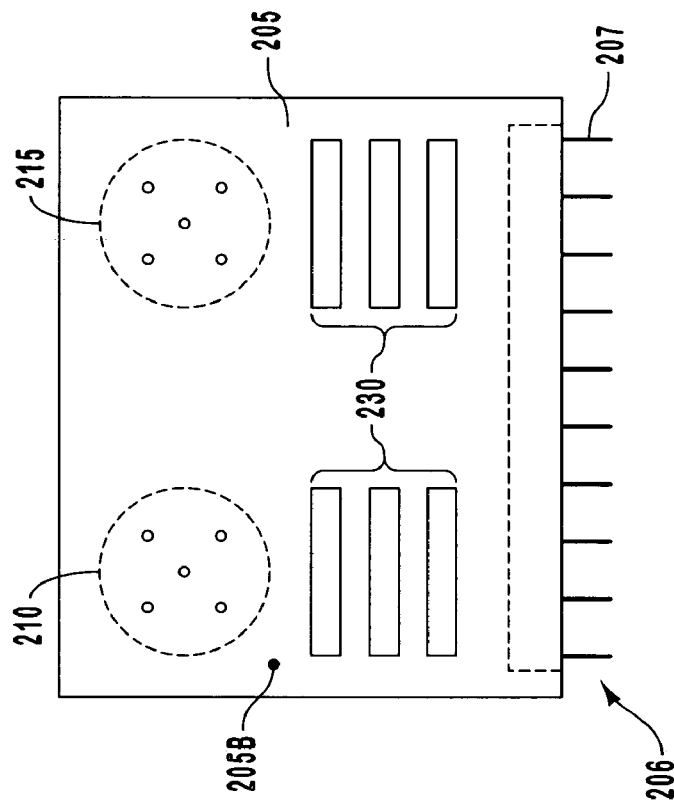
FIG. 1D is a rear view of an exemplary optical transceiver showing the arrangement of a ROSA and TOSA relative to the transceiver substrate and associated connector pins, and also indicating the presence of various components on the rear surface of the transceiver substrate.
Figure 1C:
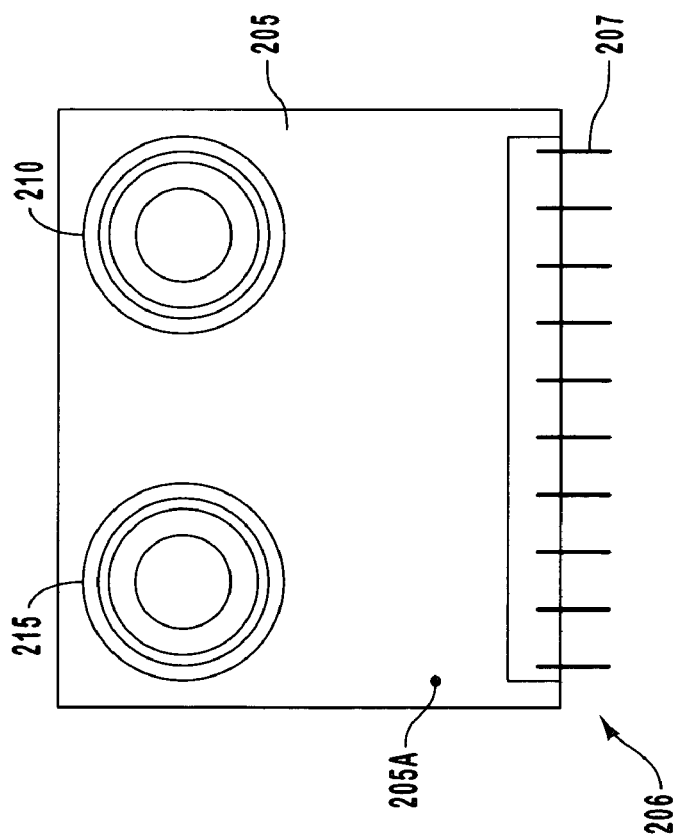
FIG. 1C is a front view of an exemplary optical transceiver showing the arrangement of a ROSA and TOSA relative to the transceiver substrate and associated connector pins.

With attention now to FIGS. 1C and 1D, further details are provided concerning the transceiver substrate 205 and associated components and devices. In general, FIG. 1C is a front view of the OSAs 210 and 215 as mounted proximate the front surface 205A of the transceiver substrate 205. In one embodiment, OSA 210 is a TOSA, and OSA 215 is a ROSA, although the OSA arrangement can be reversed based on manufacturing or other considerations.

FIG. 1C also shows the electrical connection pins 207 of connector 206 mounted on a surface of the transceiver substrate 205. As noted earlier, the electrical connection pins 207 of connector 206 provide a conductive mounting interface between the optical transceiver 100 and an HBA or other component. It should be noted further that connector 206 may be implemented in a variety of ways, examples of which include, but are not limited to, surface mount connectors, thru hole connectors, and compression-type connectors.

Although only electrical connection pins 207 are shown in the illustrated embodiment of connector 206, other components (not shown) may be implemented on the transceiver substrate such as, but not limited to, "status indicator components" such as light emitting diodes, a laser driver and/or postamplifier, a current bias driver, volatile and/or nonvolatile memory, and a thermo-electric cooler ("TEC").

Some exemplary arrangements of various types of status indicators and feedback devices, such as LEDs, within an optical transceiver are disclosed and claimed in U.S. patent application Ser. No. 10/829,742, filed Apr. 22, 2004, entitled OPTICAL TRANSCEIVER WITH INTEGRATED FEEDBACK DEVICE, while various embodiments of optical transceivers are disclosed and claimed in U.S. patent application Ser. No. 10/829,609, Apr. 22, 2004, entitled COMPACT OPTICAL TRANSCEIVERS, each of which is filed on the same day herewith, and each of which is incorporated herein in its entirety by this reference.

With reference now to FIG. 1D, a rear view of the optical transceiver 200 depicted in FIG. 1C is shown. In this view, the OSAs 210 and 215 are indicated in phantom on the rear surface 205B of the transceiver substrate 205. Electrical connection pins 207 are also shown extending downwardly from the transceiver substrate 205. Of course, the arrangement of the electrical connection pins 207, as well as that of the connector 205, may be modified as necessary to suit the requirements of a particular application. As illustrated, the rear surface 205B of the transceiver substrate 205 is also used to mount various components, circuits and devices 230.

More particularly, the rear surface 205B of the transceiver substrate 205 may have a variety of active and/or passive components, circuits and devices 230 mounted thereon. The ability to mount components, circuits and devices 230 on both sides of the transceiver substrate 205 can help the transceiver substrate 205 maintain a compact structure without any meaningful loss in functionality. Moreover, as previously described, this aids space conservation on an HBA or other device to which the optical transceiver 200 is mounted. As suggested earlier, various components, circuits and devices 230 may be mounted to the front surface 205A of the transceiver substrate 205 as well.

Figure 2D:
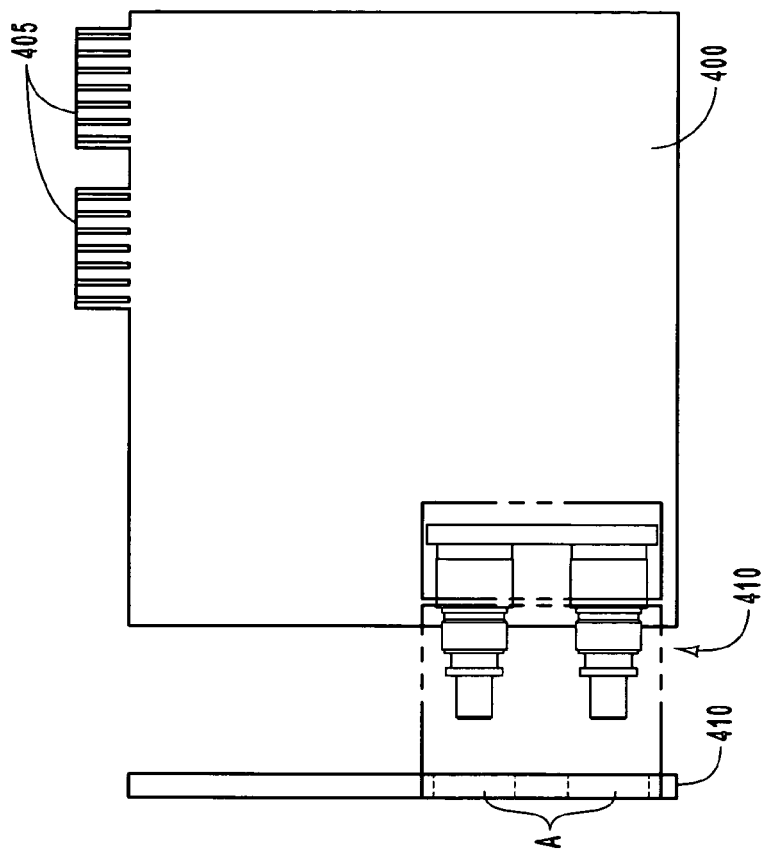
FIG. 2D is a bottom view of an exemplary optical transceiver positioned on an HBA, and illustrating the arrangement of a face plate of a host device relative to the optical transceiver.

Turning now to FIGS. 2A through 2D, details are provided concerning the use of an exemplary optical transceiver 300 in various exemplary operating environments. In particular, FIG. 2A is a side view of the optical transceiver 300 having a housing 310 that includes a pair of opposing vertical walls 310A as well as a top cover 3101B and bottom cover 310C. The OSAs 315 and 320 are at least partially disposed within the housing 310 and are arranged such that longitudinal axes "C" and "D" respectively defined by the OSAs 315 and 320 are substantially perpendicular to a vertically oriented transceiver substrate 325 which resides in a housing 330, and to which the OSAs 315 and 320 are mounted.

Exemplary implementations of the transceiver substrate 325 include various components, circuits and devices 340 which are mounted to the front and/or rear surfaces 325A and 325B, respectively, of the transceiver substrate. The transceiver substrate 325 also includes a connector 326 exemplarily implemented as an array of electrical connection pins 326A.

Similar to housing 310, the housing 330 includes a pair of opposing vertical walls 330A as well as a top cover 330B and bottom cover 330C. In some implementations, the housings 310 and 330 are integrated with each other so that a single housing is defined. As further indicated in FIGS. 2A and 2B, the housing 310 further defines a cavity 350 wherein the OSAs 315 and 320 are substantially disposed. In general, the cavity 350 at least partially defines a receptacle for receiving a fiber optic connector to be attached to one or both of the OSAs 315 and 320. Although a standard "LC" connector configuration is illustrated, alternative implementations of the optical transceiver 300 include various other types of optical cable interfaces.

Figure 2C:
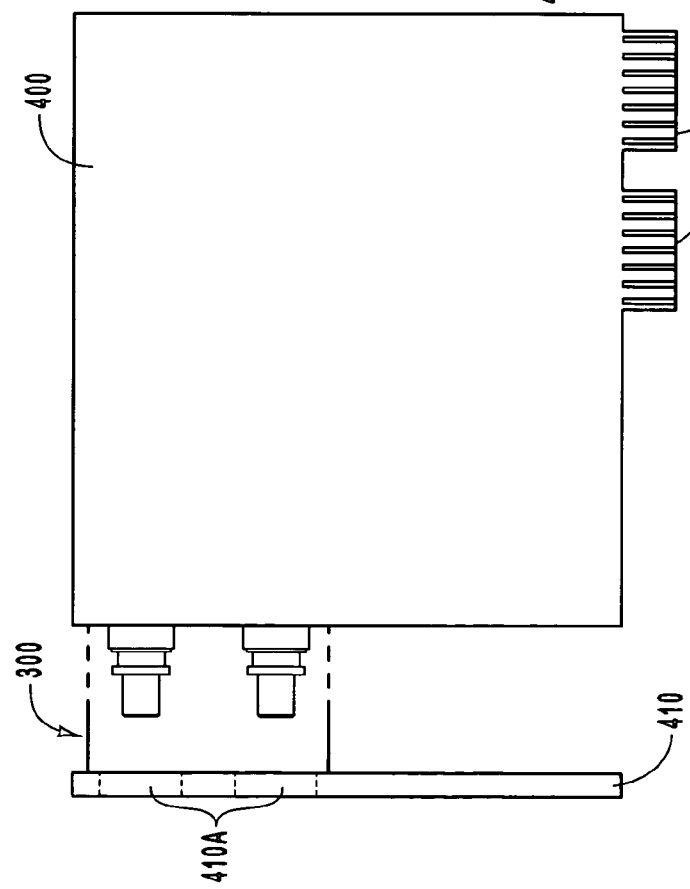
FIG. 2C is a bottom view of an exemplary optical transceiver positioned on an HBA, and illustrating the arrangement of a face plate of a host device relative to the optical transceiver.

With particular reference to FIGS. 2C and 2D, and with continuing reference to FIG. 2B, an optoelectronic interface device is illustrated that includes an optical transceiver 300 and an HBA 400. As noted earlier, exemplary embodiments of the optical transceiver 300 include a connector 326 suitable for implementing a mechanical and electrical interface between the transceiver substrate 325 and a PCB or other device. In the illustrated exemplary implementation, the connector 326 takes the form of an array of electrical connection pins 326A configured and arranged to mechanically and electrically interface with a corresponding connector (not shown of) an HBA 400 that exemplarily includes an edge connector 405 or other suitable connector for interfacing with a card, connector, or system.

Figure 3B:
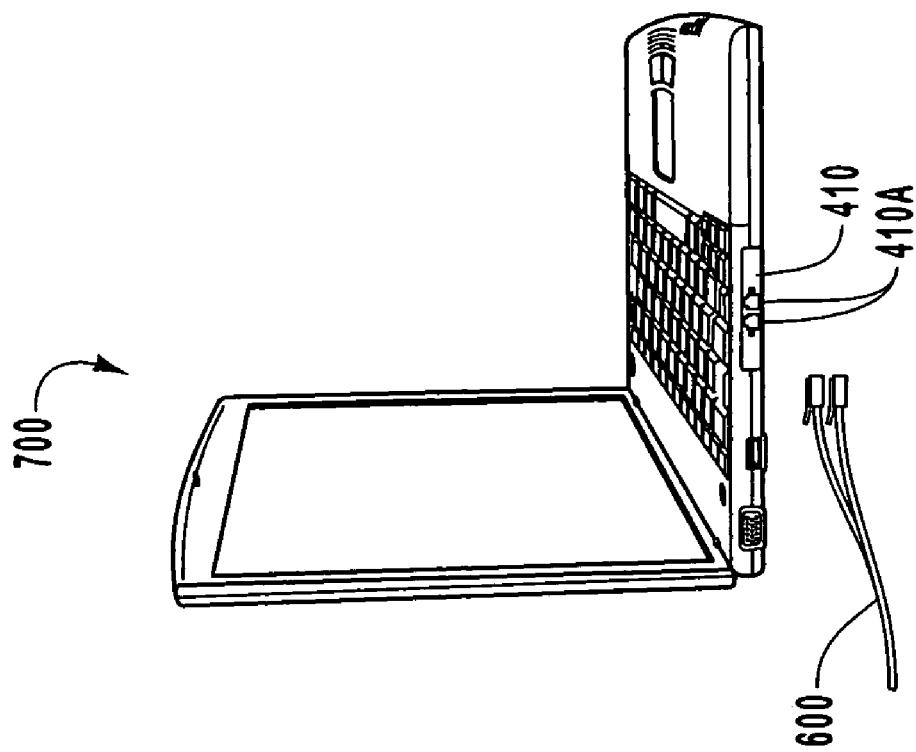
FIG. 3B is a side view a laptop computer system within which is integrated an exemplary optical transceiver.
Figure 3A:
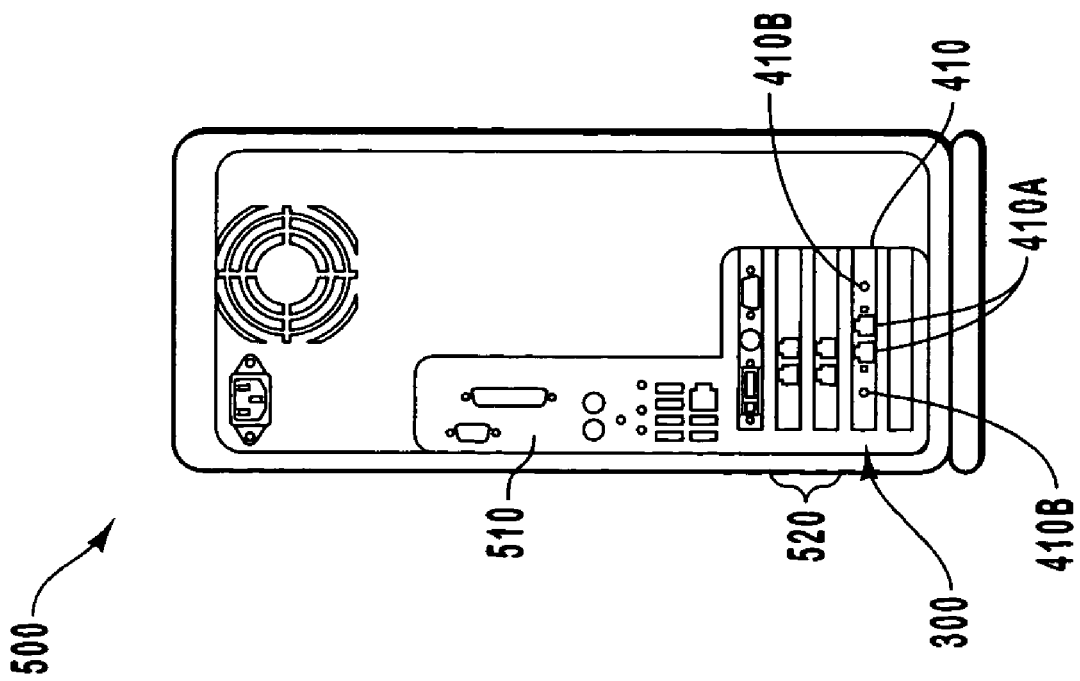
FIG. 3A is a rear view of a desktop computer system within which is integrated an exemplary optical transceiver.

Generally, the HBA 400 can be any type of printed circuit board implemented as a suitable connector interface for use with a computer system, wherein the connector interface may take the form of, for example, a peripheral component interconnect ("PCI") card having edge connectors 405 configured and arranged to interface with a desktop computer system (see FIGS. 3A and 3B). The connector interface may alternatively take the form of, for example, a printed circuit board with a serial or parallel port, or a Personal Computer Memory Card International Association ("PCMCIA") standard card. Note that as used herein, "connector interface" generally refers to a PCB or other device that acts as an interface between an optical component, such as the optical transceiver 300, and a host system such as a laptop computer, desktop computer, or portable computing systems such as personal digital assistants ("PDA").

As indicated in the top view (FIG. 2D) and bottom view (FIG. 2C) of the arrangement of the optical transceiver 300 and HBA 400, a face plate 410 is included that aids in the securement of the optical transceiver 300 and HBA 400 in a host device (not shown). The face plate 410 additionally defines suitable cutouts 410A so as to enable connection of optical cables, for example, to the optical transceiver 300. The face plate 410 may be attached to the optical transceiver 300 and/or HBA 400 or, alternatively, may be an element of the host device.

Directing attention now to FIGS. 3A and 3B, details are provided concerning some exemplary operating environments, such as host devices, for embodiments of the invention. With reference first to FIG. 3A, a desktop computer system 500 has a component interface panel 510 that includes connection interfaces for peripheral devices such as a monitor, a mouse, a keyboard, USB devices, and other components. The exemplary desktop computer system 500 also includes network connection interfaces 520 such as connection interfaces for an Ethernet cable, and/or a telephone cable.

In the illustrated implementation, the optical transceiver 300 is employed in the desktop computer system 500 in connection with an HBA 400 (not shown) such as, for example, a PCI card. In this way, the desktop computer system 500 implements a fiber optic connection interface in a similar position as the other network connections 420. Moreover, the relatively small size of the optical transceiver 300, facilitated by the use of the vertically oriented transceiver substrate 325, enables the optical transceiver 300 to be integrated within the desktop computer system 500, thereby obviating the need for additional external connectors and devices. Accordingly, a user is able to simply plug a fiber optic cable 600 directly into the desktop computer system 400.

As noted earlier, the optical transceiver 300, HBA 400 or desktop computer system 500 includes a face plate 410. Further, status indicator components 410B, such as LEDs for example, and other devices are mounted proximate the cutouts 410A of the face plate 410 so as to be perceptible by a user.

Similarly, FIG. 3B illustrates aspects of another exemplary operating environment, specifically, a laptop computer system 700, for embodiments of the invention. In this implementation, the optical transceiver 300 and HBA 400 are configured to slide into an available port of the laptop computer system 700, wherein such ports include, among others, PCMCIA ports. The fiber optic cable 600 can then be inserted directly into the laptop computer system 700.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An optical device comprising:
   a housing;
   at least one optical subassembly substantially disposed within the housing and defining a longitudinal axis, the at least one optical subassembly including a plurality of electrical connections;
   an optoelectronic component mounted within the optical subassembly and in communication with at least one of the electrical connections of the at least one optical subassembly;
   a substrate substantially disposed within the housing and residing in a plane that is substantially perpendicular to the longitudinal axis defined by the at least one optical subassembly, the substrate including electronic circuitry, and the substrate including a plurality of electrical connections, each of which is configured to interface with a corresponding electrical connection of the at least one optical subassembly, each of the at least one optical subassembly being both electrically and mechanically coupled to the substrate by the plurality of electrical connections of the at least one optical subassembly; and
   a connector disposed on one end of the substrate and mounted on a surface of the substrate within the plane that is substantially perpendicular to the longitudinal axis.

2. The optical device as recited in claim 1, wherein the at least one optical subassembly comprises at least one of a transmit optical subassembly and a receive optical subassembly.

3. The optical device as recited in claim 1, wherein the connector is in electrical communication with at least some of the electronic circuitry of the substrate.

4. The optical device as recited in claim 3, wherein the substrate is configured to connect to a host bus adapter.

5. The optical device as recited in claim 1, wherein the at least one optical subassembly is mechanically and electrically connected to the substrate.

6. An optoelectronic interface device suitable for use in implementing an optical connection to a host device, comprising:
   a host bus adapter having a printed circuit board with at least one connector for electrically interfacing with the host device; and
   an optical transceiver configured to mechanically and electrically interface with the host bus adapter and comprising:
      a housing;
      a transmit optical subassembly and a receive optical subassembly substantially disposed within the housing, each optical subassembly defining a corresponding longitudinal axis, an optical transmitter being mounted within the transmit optical subassembly and an optical receiver being mounted within the receive optical subassembly;
      a transceiver substrate substantially disposed within the housing and residing in a plane that is substantially perpendicular to the longitudinal axes respectively defined by the transmit optical subassembly and the receive optical subassembly, wherein the transmit optical subassembly and receive optical subassembly are mounted upon the transceiver substrate by electrical connections, the electrical connections securing the transmit optical subassembly and receive optical subassembly to the substrate, the transceiver substrate including electronic circuitry; and
      a connector located on an end of the transceiver substrate, the connector mounted on a surface of the transceiver substrate in the plane that is substantially perpendicular to the longitudinal axes.

7. The optoelectronic interface device as recited in claim 6, wherein the optoelectronic interface device is configured to be substantially received within a standard slot of the host device.

8. The optoelectronic interface device as recited in claim 7, wherein the standard slot comprises one of a PCI card slot; and a PCMCIA card slot.

9. The optoelectronic interface device as recited in claim 6, wherein the host bus adapter comprises a printed circuit board for one of a peripheral component interconnect card; and, a PCMCIA card.

10. The optoelectronic interface device as recited in claim 6, further comprising a face plate defining cutouts and being attached, at least indirectly, to at least one of: the optical transceiver; and, the host bus adapter.

11. The optoelectronic interface device as recited in claim 10, wherein the faceplate includes at least one status indicator.

12. The optoelectronic interface device as recited in claim 6, wherein the connector of the optical transceiver is electrically connected to the host bus adapter, the printed circuit board of the host bus adapter residing in a plane that is perpendicular to the plane of the transceiver substrate and parallel to the longitudinal axis of each of the transmit optical subassembly and the receive optical subassembly.

13. An optical transceiver comprising:
   a housing;
   a transmit optical subassembly substantially disposed within the housing and defining a longitudinal axis, an optical transmitter being mounted within the transmit optical subassembly;
   a receive optical subassembly substantially disposed within the housing and defining a longitudinal axis, an optical receiver being mounted within the receive optical subassembly;
   a transceiver substrate substantially disposed within the housing and residing in a plane that is substantially perpendicular to the longitudinal axes respectively defined by the transmit optical subassembly and the receive optical subassembly, the transceiver substrate including electronic circuitry, and the transceiver substrate being physically and electrically connected to the transmit optical subassembly and the receive optical subassembly by respective electrical connections of the transmit optical subassembly and the receive optical subassembly; and
   a connector connected to the transceiver substrate, the connector mounted at a surface of the transceiver substrate in the plane, wherein the connector electrically and mechanically connects the transceiver substrate with a host bus adapter.

14. The optical transceiver as recited in claim 13, wherein the optical transceiver is suitable for use in connection with data rates at least as high as about 10 Gbps.

15. The optical transceiver as recited in claim 13, wherein the connector is configured to interface with a host bus adapter at an edge of the host bus adapter.

16. The optical transceiver as recited in claim 13, wherein the substrate includes a connector configured to interface with one of: a PCI card; and, a PCMCIA card.

17. The optical transceiver as recited in claim 13, wherein the transceiver substrate defines front and rear sides, portions of the electronic circuitry being disposed on both the front and rear sides of the transceiver substrate.

18. The optical transceiver as recited in claim 13, wherein at least one of the transmit optical subassembly and the receive optical subassembly includes at least one electrical pin configured and arranged to be received in a corresponding electrical receptacle of the transceiver substrate.

19. The optical transceiver as recited in claim 13, wherein at least one of the transmit optical subassembly and the receive optical subassembly includes at least one electrical receptacle configured and arranged to receive a corresponding electrical pin of the transceiver substrate.

* * * * *

UNITED STATES PATENT AND TRADEMARK OFFICE
CERTIFICATE OF CORRECTION

PATENT NO. : 7,215,889 B2  Page 1 of 1
APPLICATION NO. : 10/829608
DATED : May 8, 2007
INVENTOR(S) : Light It is certified that error appears in the above-identified patent and that said Letters Patent is hereby corrected as shown below:

Column 7
Line 15, change "3101B" to --310B--

Column 10
Line 10, add --:-- after "of"
Line 14, add --:-- after "of"

Signed and Sealed this

Fourteenth Day of September, 2010

David J. Kappos
*Director of the United States Patent and Trademark Office*